United States Patent [19]
Paoli

[11] Patent Number: 5,058,121
[45] Date of Patent: Oct. 15, 1991

[54] COUPLING STRUCTURES FOR A PHASE-LOCKED LASER ARRAY

[75] Inventor: Thomas L. Paoli, Los Altos, Calif.

[73] Assignee: Xerox Corporation, Rochester, N.Y.

[21] Appl. No.: 537,382

[22] Filed: Jun. 13, 1990

[51] Int. Cl.$^5$ ................................................ H01S 3/19
[52] U.S. Cl. ...................................... 372/50; 372/45; 372/46
[58] Field of Search ........................ 372/44, 45, 46, 50

[56] References Cited

U.S. PATENT DOCUMENTS

| | | | |
|---|---|---|---|
| 4,217,561 | 8/1980 | Scifres et al. | 331/94.5 H |
| 4,219,785 | 8/1980 | Scifres et al. | 331/94.5 H |
| 4,470,143 | 9/1984 | Kitamura et al. | 372/50 |
| 4,578,791 | 3/1986 | Chen | 372/50 |
| 4,641,311 | 2/1987 | Ackley | 372/18 |
| 4,718,069 | 1/1988 | Streifer et al. | 372/50 |
| 4,719,632 | 1/1988 | Lindsey et al. | 372/50 |
| 4,719,634 | 1/1988 | Streifer et al. | 372/46 |
| 4,722,089 | 1/1988 | Botez et al. | 372/50 |
| 4,751,711 | 6/1988 | Welch et al. | 372/50 |
| 4,802,182 | 1/1989 | Thornton et al. | 372/50 |
| 4,847,847 | 7/1989 | Matsui et al. | 372/50 |
| 4,852,113 | 7/1989 | Botez | 372/50 |

OTHER PUBLICATIONS

"Impurity-Induced Disordered Phase Modulators in AlGaAs/GaAs Quantum-Well and Double-Heterostructure Waveguides," T. Hausken et al., *Applied Physics Letters*, 53 (9), 8/29/88.

"Propogation, Modulation and Oscillation in Optical Dielectric Waveguides," pp. 354–402.

"Dependence of Central-Lobe Output Power on Fill Factor of an In-Phase Laser Array," J. E. Epler et al., *Electronics Letters*, 7/2/87, vol. 23, No. 14.

"Reduction of Turn-On Delay in Laser Diode Optical Switch," M. Ikeda, *Electronics Letters*, 19, 53–54 (1983).

"Tandem Switching Characteristics for Laser Diode Optical Switches," M. Ikeda, *Electronics Letters*, 3/14/85, vol. 21, No. 6, pp. 252–254.

"Laser Diode Switch," M. Ikeda, *Electronics Letters*, 17, 899 (1981).

"Laser Diode Optical Switch Module," Kataka, *Electronics Letters*, 20, 438 (1984).

"High-Power AlGaAs Buried Heterostructure Lasers with Flare Flared Waveguides," D. F. Welch et al., *Appl. Phys. Lett.*, 50 (5), 2/2/87.

"High-Power (cw) In-Phase Locked Y Coupled Laser Arrays," D. F. Welch et al., *Appl. Phys. Lett.*, 49 (24), 12/15/86.

*Primary Examiner*—James W. Davie
*Attorney, Agent, or Firm*—Townsend and Townsend

[57] ABSTRACT

Improved coupling structures for an index-guided laser array utilize passive transparent waveguides to improve coupling and phase-lock the array.

29 Claims, 3 Drawing Sheets

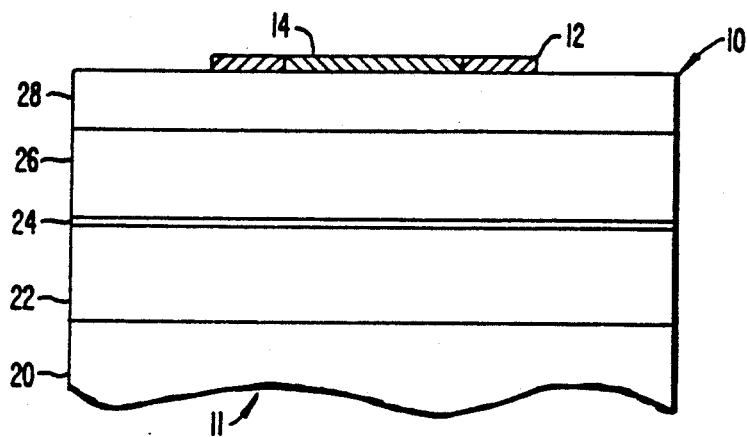
FIG._1.
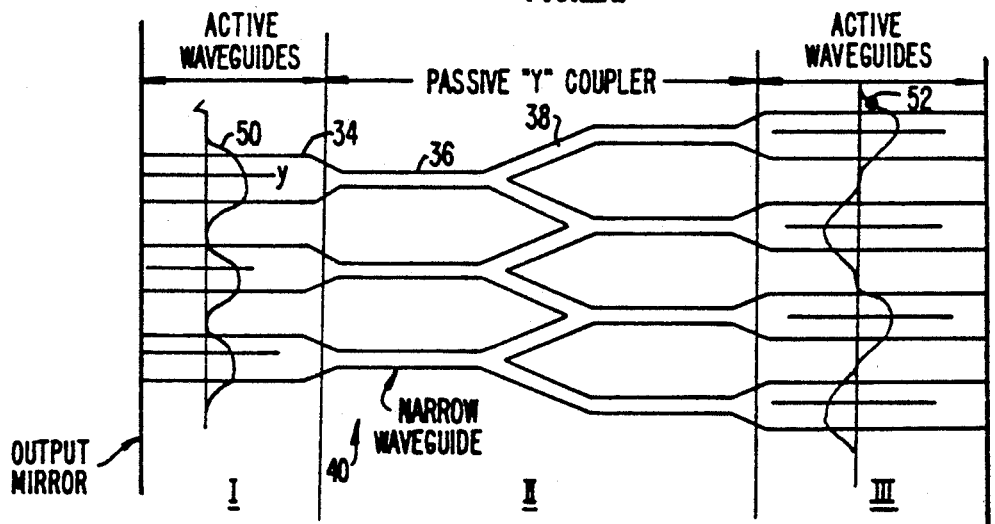
FIG._2.
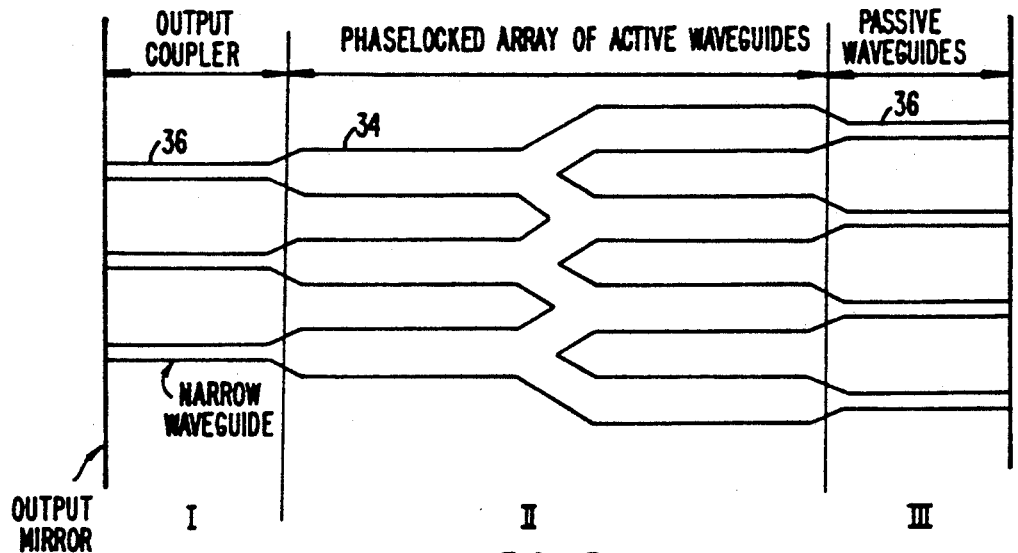
FIG._3.

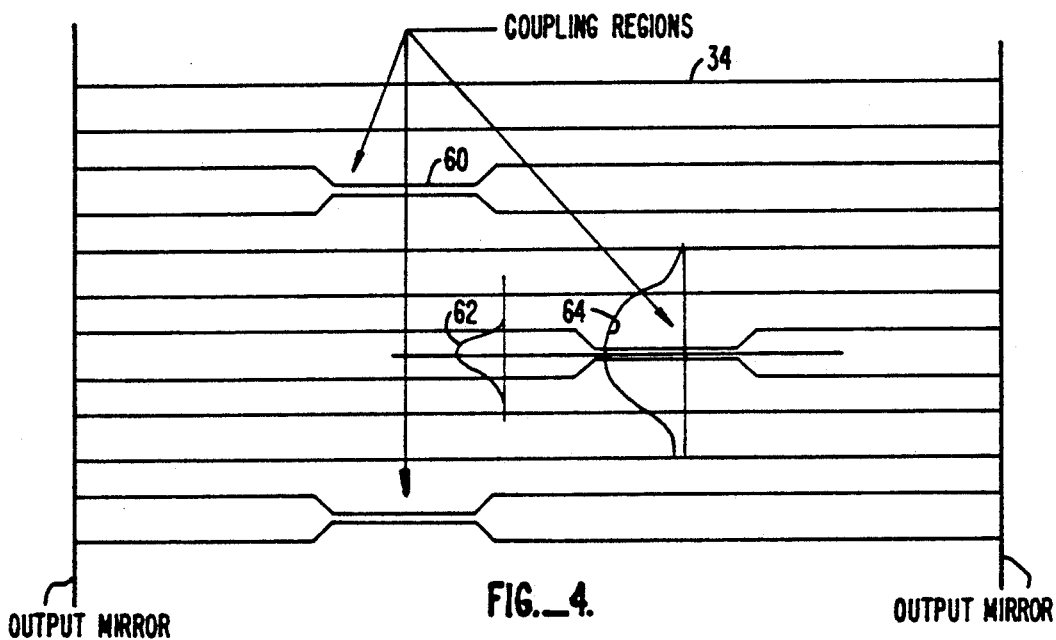
FIG._4.
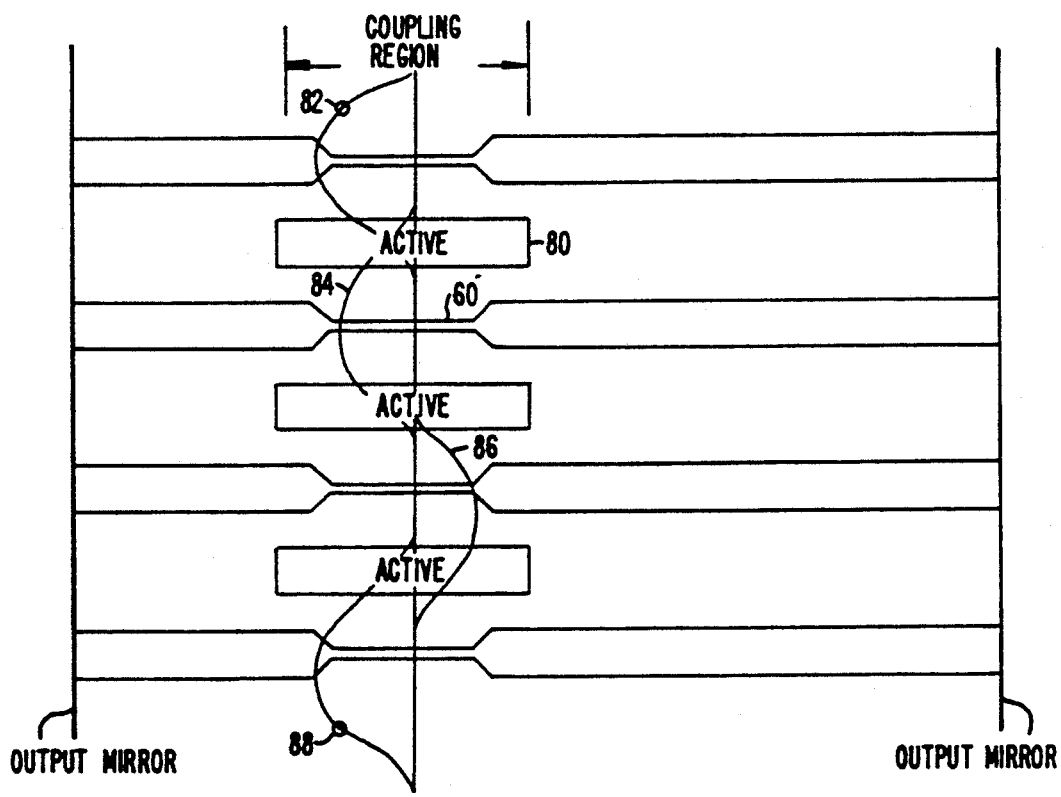
FIG._5.

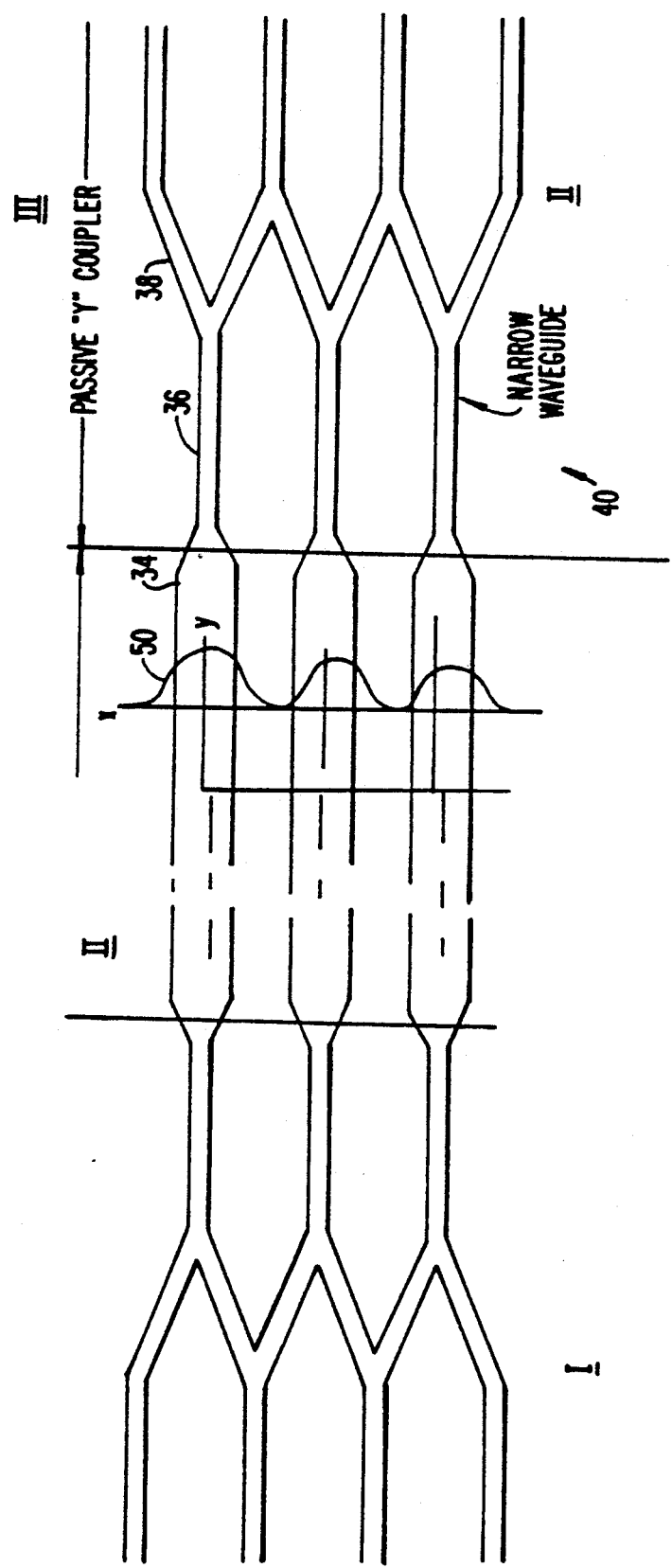
FIG._6.

5,058,121

COUPLING STRUCTURES FOR A PHASE-LOCKED LASER ARRAY

FIELD OF THE INVENTION

The invention relates to a phased-array semiconductor laser and more particularly to a coupling structure for the laser.

DESCRIPTION OF THE RELEVANT ART

Phased-array lasers include a set of directly coupled waveguide amplifiers which generate phase-locked lightwaves. Each waveguide has a terminal aperture at a laser facet that radiates the lightwaves generated in the waveguide amplifier. The use of a set of waveguide amplifiers provides more energy than a single waveguide and coupling the waveguide amplifiers forces each waveguide to generate lightwave energy only in modes that are phase-locked so that the resulting emitted light may be focused into a highly-resolved beam.

It is well-known to use y-shaped waveguide amplifiers to obtain in-phase output lightwaves. Lightwaves propagating in each waveguide amplifier in the array will be deflected into adjacent waveguide amplifiers by the y-shaped branches of the amplifiers and out-of-phase modes of the light waves will radiate away from the stripes and be absorbed.

A second well-known coupling method is to dispose the waveguide amplifiers close together so that their evanescent electric fields overlap. However, this method supports array modes where the modes of the individual waveguide amplifiers are not in phase.

As laser applications increase improved coupling systems are needed to provide stable, in-phase operation at high power.

SUMMARY OF THE INVENTION

The present invention is an improved structure for phase-locking a laser array in the in-phase mode. According to one aspect of the invention, a coupling structure formed of transparent, passive waveguides and y-couplers is disposed between arrays of parallel amplification waveguides. Because the coupling structure is transparent it is not forward-biased and the charge carrier density is very low. Accordingly, phase distortions due to carriers are reduced to achieve stable output at high power.

According to another aspect of the invention, a complementary structure to that described above is utilized to further discriminate against the out-of-phase array mode.

According to a still further aspect of the invention, waveguide radiators formed of narrow, transparent waveguide sections form part of forward-biased amplification waveguides. The radiator segments broaden the evanescent field to produce coupling between adjacent amplification waveguides.

According to a further aspect of invention, active coupling stripes are disposed between radiator segments of adjacent waveguides to enhance the in-phase mode.

Additional features and advantages will be apparent in view of the appended drawing and following detailed description.

BRIEF DESCRIPTION OF THE DRAWINGS

FIG. 1 is a cross-sectional view of a heterostructure laser;

FIG. 2 is a top view of an embodiment of the invention utilizing a passive coupling region using y-shaped couplers;

FIG. 3 is a top view of an embodiment of the invention utilizing an active coupling region using y-shaped couplers;

FIG. 4 is a top view of an embodiment of the invention utilizing radiator segments to improve evanescent coupling;/

FIG. 5 is a top view of an embodiment of the invention utilizing short active stripes to enhance the invention in-phase array mode; and FIG. 6 is a top view of an embodiment utilizing y-coupled passive waveguides.

DETAILED DESCRIPTION OF THE PREFERRED EMBODIMENTS

The primary focus of the invention is the provision of an improved coupling structure for supporting only the in-phase mode of the array.

Referring now to FIGS. 1 and 2, there is illustrated an enlarged view of a semiconductor structure 10 comprising a plurality of epitaxially deposited layers 22–28 on substrate 20. As an example of a semiconductor structure 10 is a semiconductor heterostructure. Structure 10 may include a substrate 20, which may be comprised of n-GaAs, on which are consecutively deposited in an MO-CVD reactor epitaxial layers 22–28, as is known in the art. These epitaxially deposited layers may be, for example, as follows: Cladding layer 22 of n-Ga$_{1-y}$Al$_y$As wherein, for example, y=0.40; active region 24 comprising a layer of GaAs or Ga$_{1-x}$Al$_x$As where y>x, or a single quantum well layer of GaAs or a multiple quantum well of alternating layers of GaAs and Ga$_{1-x}$Al$_x$As or alternating layers of Ga$_{1-x}$Al$_x$As and Ga$_{1-z}$Al$_z$As where y>z>x; cladding layer 26 of p-Ga$_{1-y}$Al$_y$As and a cap layer 28 of p+GaAs. In the particular example here, active region 24 comprises multiple quantum wells. This active region is comprised of four 12 nm quantum wells 32 of Ga$_{1-x}$Al$_x$As, wherein x=0.05, separated by three 6 nm barriers 34 of Ga$_{1-z}$Al$_z$As, wherein z=0.20. Therefore, the active region has a thickness, L$_z$, of approximately 66 nm.

FIG. 2 is a top view of the active layer 24 depicting a preferred embodiment of the invention. The substrate is divided into first, second, and third parts I, II, and III separated by first and second boundaries 30 and 32. A set of index-guided amplification waveguides 34 are oriented along a horizontal axis and disposed in the active region of first and third parts I and III. The first and third parts are electrically forward-biased so that lightwaves are generated and amplified in the amplification waveguides 34 under lasing conditions.

A set of low-loss, index-guided passive waveguides 36 and y-couplers 38 are disposed in the active layer 24 of the second section II to form a coupling structure 40. A first set of passive waveguides 36 are oriented co-axially to the amplification waveguides 34 in the first part I and coupled thereto at the first boundary 30 and a second set are oriented co-axially to the amplification waveguides 34 in the third region III and coupled thereto at the second boundary 32. Each y-coupler 38 couples an adjacent pair of passive waveguides 36 in the second set to one of the passive waveguides 36 in the first set. Thus, due to the geometry of the array, one more passive waveguide exists on one side of the coupler than on the other side.

A set of graphs 50 is superimposed on the structure depicted in FIG. 2 to indicate the magnitude of the electric fields of the lightwaves guided in the amplification waveguides 34. These graphs are highly oversimplified but serve to describe the function of the coupling structure 40. Each graph 50 depicts the magnitude of the electric field on a horizontal y-axis as a function of the lateral position (x-axis) of the amplification waveguide 34. The graphs depict the various possible array modes and do not illustrate the actual operation of the system.

In region III the out-of-phase array mode is depicted. The electric fields in adjacent waveguides point in different directions. In region I the in-phase array mode is depicted where all the electric fields point in the same direction. Generally, there are at least as many array modes as waveguides in the array and all modes except the in-phase mode should be suppressed to form a highly resolved output beam.

The y-couplers cause out-of-phase modes to radiate away from the y-couplers and cause the lightwaves generated in the amplification waveguides 34 to be phase-locked in the in-phase array mode.

A method for forming the index-guided amplification waveguides 34 and low-loss index-guided passive waveguides and y-couplers 38 and 36 is fully disclosed in U.S. Pat. No. 4,802,182 to Thornton et al. and is hereby incorporated by reference.

The active layer in the index-guided amplification waveguides, passive waveguides, and y-couplers 34, 36, and 38 has a higher index of refraction than the neighboring areas of active layer 24 and of cladding layers 22 and 26. Thus, the light generated in the amplification waveguides and low-loss waveguides 30 and 32 is confined by the well-known phenomena of total internal reflection.

As described in the above-referenced Thornton et al. patent, the passive waveguides 36 and y-couplers 38 are integrally formed in the active medium and have an energy bandgap greater than the energy of the amplified lightwaves so that the coupling structure is nearly transparent to the amplified waveguides and does not need to be forward-biased to transmit the lightwaves. These transparent waveguides 36 can be narrower than the amplification waveguides 34. If the transparent waveguides 36 are sufficiently narrow they provide the additional function of stripping higher order modes and thus increase the stability of the laser.

The coupling structure 40 is not forward-biased and thus functions as a passive element. Accordingly, the charge carrier density in the y-shaped couplers 38 is very low so that phase distortions induce by charged carriers are eliminated and phase-locked operation at high power is stabilized. Furthermore, the regions of the coupling structure 40 where the narrow passive waveguides 36 are coaxial with an amplification waveguide 34 are more effective in radiating the out-of-phase array mode.

FIG. 3 depicts an embodiment of the invention that is complementary to the embodiment depicted in FIG. 2. The coupling structure 40 in the second part II is formed of amplification waveguides 34 and the passive waveguides 36 are disposed in the active region in the first and third parts I and III. In this embodiment, the discrimination of the out-of-phase mode is further increased.

In this embodiment, the amplification waveguides are not coupled to the output mirror 100 so that the charge carrier density near the output mirror is low and special coatings are not required.

FIGS. 4 and 5 depict embodiments of the invention that increase the effectiveness of evanescent coupling. In FIG. 4 a plurality of parallel, equispaced amplification waveguides 34 are disposed in the active region and forward biased to generate and amplify lightwaves under lasing conditions.

A part of each alternate amplification waveguide 34 is formed by a radiator segment 60. These segments 60 are transparent, passive waveguides that are narrower than the amplification waveguide 34. The radiator segments 60 and the amplification waveguides 34 can be formed by the impurity induced layer disordering described in the above referenced Thornton et al. patent. The radiator segments 60 are transparent and do not need to be forward biased. Radiator segments 60 may be included in every amplification waveguide 34 for stronger coupling.

Graphs 62 and 64 depict the intensity of the electric field in the lightwave modes guided by the amplification waveguide and radiator segment 34 and 60 respectively. The amplitude of the field decreases exponentially outside of an index-guided waveguide. It is well-known that the rate at which the field falls off decreases as the width of the waveguide decreases. Thus, the light spreads out for the narrow radiator segment 60 to improve evanescent coupling with adjacent amplification waveguides 34.

In FIG. 5 the radiator segments 60 are included in each amplification waveguide 34 and disposed along a single axis. An active region, comprising a small section of forward biased amplification waveguide is disposed in the active layer 24 between adjacent radiator segments 60.

Graphs 82 and 84 illustrate how the active region boosts the in-phase mode and lowers its threshold. The fields from both radiating elements are positive and thus are summed at the active region. The summed field is amplified to increase the power of the in-phase mode.

Graphs 86 and 88 depict how the fields cancel at the active region 84 for the out-of-phase mode. Thus, the out-of-phase mode is not enhanced by the active regions 80.

The invention has now been described with reference to the preferred embodiments. Alternatives and substitutions will now be obvious to persons of ordinary skill in the art. Accordingly, it is not intended to limit the invention except as provided by the appended claims.

What is claimed is:

1. A semiconductor laser array comprising:

a monolithic semiconductor structure, divided into first, second, and third parts with the first and second parts separated by a first boundary and the second and third parts separated by a second boundary, each of said parts having a plurality of semiconductor heterostructure layers disposed over a substrate, at least one of said layers of each said part being an active region for light amplification and propagation under lasing conditions;

means, electrically coupled only to said first and third parts, for applying an electrical forward bias to said layers in said first and third parts;

a first plurality of substantially parallel, spaced apart, two-dimensional index-guided amplification waveguides, disposed in the active region of said first part, oriented parallel to a first axis in said active layer, with each of said amplification waveguides having a predetermined width, and having a first end terminating at said first boundary, for generating and amplifying light waves at a given wavelength in response to said electrical forward bias;

a second plurality, equal to one more than said first plurality, of substantially parallel, spaced apart, two-dimensional index-guided amplification waveguides, disposed in the active region region of said third part, oriented parallel to said first axis in said active layer, with each of said amplification waveguides having a predetermined width, and having a first end terminating at said second boundary, for generating and amplifying light waves at a given wavelength in response to said electrical forward bias;

a first plurality of substantially parallel, spaced apart, low-loss two-dimensional index-guided passive waveguides disposed in the active region of said second part, each passive waveguide oriented co-axially to a corresponding amplification waveguide in said first part and co-extensively coupled thereto at said first boundary, with each passive waveguide of width S, for guiding said amplified lightwaves generated in said corresponding coupled amplification waveguide;

a second plurality of substantially parallel, spaced apart, low-loss, two-dimensional index-guided passive waveguides disposed inn the active region of said second part, each passive waveguide oriented coo-axially to a corresponding amplification waveguide in said third part and coo-extensively coupled thereto at said second boundary, for guiding said amplified lightwaves generated in said corresponding coupled amplification waveguide; and a first plurality of low-loss, two-dimensional index-guided y-shaped couplers, disposed in the active region of said second part, for interconnecting each passive waveguide in said first plurality with two adjacent waveguides in said second plurality to radiate out-of-phase modes so that the laser operates in the in-phase mode.

2. The laser array of claim 1 with:
each passive waveguide of width S, with the magnitude of the width S less than the critical width required for substantially complete confinement of said generated light.

3. The laser array of claim 1 wherein at least one of said first, second, or third parts is formed utilizing a layer disordering technique.

4. The laser array of claim 1 wherein at least one of said first, second, or third parts is formed by utilizing impurity induced layer disordering.

5. A semiconductor laser array comprising:
a monolithic semiconductor structure, divided into first, second, and third parts with the first and second parts separated by a first boundary and the second and third parts separated by a second boundary, each of said parts having a plurality of semiconductor heterostructure layers disposed over a substrate, at least one of said layers of each said part being an active layer for light amplification and propagation under lasing conditions;

means, electrically coupled only too said second part, for applying an electrical forward bias to said layers in said second part;

a first plurality of substantially parallel, spaced apart, low-loss, two-dimensional index-guided passive waveguides, disposed in the active region of said first part, oriented parallel to a first axis in said active layer, with each of said low-loss waveguides having a predetermined width, and having a first end terminating at said first boundary;

a second plurality, equal to one more than said first plurality, of substantially parallel, spaced apart,, two-dimensional, low-loss, index-guided passive waveguides, disposed in the active region of said third pat, oriented parallel to said first axis in said active layer, with each of said low-loss waveguides having a predetermined width, and having a first end terminating at said second boundary;

a first plurality of substantially parallel, spaced apart, two-dimensional index-guided amplification waveguides disposed in the active region of said second part, each amplification waveguide oriented co-axially to a corresponding passive waveguide in said first part and coextensively coupled thereto at said first boundary, with each amplification waveguide for generating and amplifying lightwaves at a given wavelength in response to said electrical forward bias;

a second plurality of substantially parallel, spaced apart, two-dimensional index-guided amplification waveguides disposed in the active region of said second part, each amplification waveguide oriented co-axially to a corresponding passive waveguide in said third part and co-extensively coupled thereto at said second boundary, with each amplification waveguide for generating and amplifying lightwaves at a given wavelength in response to said electrical forward bias; and a first plurality of, two-dimensional index-guided y-shaped coupling amplification waveguides, disposed in the active region of said second part, for interconnecting each amplification waveguide in said first plurality with two adjacent amplification waveguides i said second plurality to radiate out-of-phase modes so that the laser operates in the in-phase mode.

6. The laser array of claim 5 with:
each passive waveguide of width S, with the magnitude of the width S less that the critical width required for substantially complete confinement of said generated light.

7. The laser array of claim 5 wherein at least one of said first, second, or third parts is formed utilizing a layer disordering technique.

8. The laser array of claim 5 wherein at least one of said first, second, or third parts is formed by utilizing impurity induced layer disordering.

9. A semiconductor laser array comprising:
a monolithic structure, divided into first, second, and third parts with the first and second parts separated by a first boundary and the second and third parts separated by a second boundary, and each of said parts separated by a second boundary, and each of said parts having an active layer;

means for electrically forward biasing only said second part;

a first plurality of parallel, low-loss, passive waveguides disposed only inn said first part and terminating at said first boundary;

a second plurality of parallel, low-loss, passive waveguides disposed only in said third part and terminating at said second boundary; and a plurality of index-guided amplification waveguides disposed in the second part for propagating only an in-phase array mode and oriented co-axially and coupled with the passive waveguides at said first and second boundaries.

10. The laser array of claim 9 wherein said plurality of amplification waveguides in said second part is in the form of a y-coupled waveguide array.

11. The laser array of claim 9 wherein at least one of said first, second, or third parts is formed utilizing a layer disordering technique.

12. The laser array of claim 9 wherein at least one of said first, second, or third parts is formed by utilizing impurity induced layer disordering.

13. A semiconductor laser array comprising:
a monolithic semiconductor structure, divided into first, second, and third parts with the first and second parts separated by a first boundary and the second and third parts separated by a second boundary, each of said parts having a plurality of semiconductor heterostructure layers disposed over a substrate, at least one of said layers of each said part being an active layer for light amplification and propagation under lasing conditions;
means, electrically coupled only to said second part, for applying an electrical forward bias to said layers in said second part;
a first plurality of substantially parallel, spaced apart, y-coupled, low-loss, two-dimensional index-guided passive waveguides, disposed in the active region of said first part, oriented parallel to a first axis in said active layer, with each of said low-loss waveguides having a width S, and having a first end terminating at said first boundary;
a second plurality, substantially parallel, spaced apart, y-coupled, two-dimensional, low-loss, index-guided passive waveguides, disposed in the active region of said third part, oriented parallel to said first axis in said active layer, with each of said low-loss waveguides having a width S, and having a first end terminating at said second boundary;
a plurality of substantially parallel, spaced apart, two-dimensional index-guided amplification waveguide disposed in the active region of said second part, each amplification waveguide oriented co-axially to a corresponding passive waveguide in said first part and said second part and co-extensively coupled thereto at said first and second boundaries, respectively, with each amplification waveguide for generating and amplifying lightwaves at a given wavelength in response to said electrical forward bias, with said y-coupled passive waveguides for phase-locking the lightwaves generated in said amplification waveguides.

14. The laser array of claim 13 wherein at least one of said first, second, or third parts is formed utilizing a layer disordering technique.

15. The laser array of claim 13 wherein at least one of said first, second, or third parts is formed by utilizing impurity induced layer disordering.

16. The laser array of claim 13 with each passive waveguide or width S and with the magnitude or width S less than a critical width required for substantially complete confinement of said generated light.

17. A semiconductor laser array comprising:
a monolithic structure, divided into first, second, and third parts with the first and second parts separated by a first boundary and the second and third parts separated by a second boundary, and each of said parts having an active layer;
means for electrically forward biasing only said second part;
a first plurality of, low-loss, passive waveguides disposed only in said first part and terminating at said first boundary for propagating only an in-phase array mode;
a second plurality of, low-loss passive waveguides disposed only inn said third part and terminating at said second boundary for propagating only an in-phase array mode; and
a plurality of parallel, spaced-apart, index-guided amplification waveguides disposed in the second part for generating and amplifying light waves and oriented co-axially and co-extensibly coupled to the passive waveguides at said first and second boundaries.

18. The laser array of claim 17 wherein at least one of said first or second pluralities of passive waveguides is in the form of a y-coupled waveguide array.

19. The laser array of claim 17 wherein at least one of said first, second, or third parts is formed utilizing a layer disordering technique.

20. The laser array of claim 17 wherein at least one of said first, second, or third parts is formed utilizing impurity induced layer disordering.

21. A semiconductor laser array comprising:
a monolithic semiconductor structure, divided into first, second, and third parts with the first and second parts separated by a first boundary and the second and third parts separated by a second boundary, and each of said parts having at least an active layer for amplification and propagation of light waves under lasing conditions;
means for electrically forward biasing only said first and third parts;
a first plurality of spaced-apart, amplification waveguides disposed in said first part for generating and amplifying light waves and terminating at said first boundary;
a second plurality of spaced-apart, amplification waveguides disposed in the second part for generating and amplifying light waves and terminating at said second boundary; and
a plurality of low-loss, two-dimensional, passive waveguides disposed only in said second part for propagating only an in-phase array mode and oriented co-axially and co-extensively coupled to the amplification waveguides at said first and second boundaries.

22. The laser array of claim 21 wherein said plurality of passive waveguides in said second part is in the form of a y-coupled waveguide array.

23. The laser array of claim 21 wherein at least one of said first, second, or third parts is formed utilizing a layer disordering technique.

24. The laser array of claim 21 wherein at least one of said first, second, or third parts is formed utilizing impurity induced layer disordering.

25. The laser array of claim 21 wherein at least one of said first or second pluralities are parallel, index-guided amplification waveguides.

26. A semiconductor laser array comprising:
a monolithic semiconductor structure, divided into first, second, and third parts with the first and second parts separated by a first boundary and the second and third parts separated by a second boundary, and each of said parts having at least an active layer for amplification and propagation of light waves under lasing conditions;

means for electrically forward biasing only said first and third parts;

a first plurality of amplification waveguides disposed in said first part for propagating only an in-phase array mode and terminating at said first boundary;

a second plurality of amplification waveguides disposed in said third part for propagating only an in-phase array mode and terminating at said second boundary; and a plurality of parallel, low-loss passive waveguides disposed only in said second part and oriented coo-axially and co-extensively coupled to the amplification waveguides at said first and second boundaries.

27. The laser array of claim 26 wherein at least one of said first or second pluralities or amplification waveguides is in the form of a y-coupled waveguide array.

28. The laser array of claim 26 wherein at least one of said first, second, or third parts is formed utilizing a layer disordering technique.

29. The laser array of claim 26 wherein at least one of said first, second, or third parts is formed utilizing impurity induced layer disordering.

* * * * *